United States Patent
Steigerwald et al.

(10) Patent No.: US 8,085,060 B2
(45) Date of Patent: Dec. 27, 2011

(54) SYSTEM AND METHOD FOR EVALUATING THE ELECTROMAGNETIC COMPATIBILITY OF INTEGRATED CIRCUITS IN AN IN-SITU ENVIRONMENT

(75) Inventors: Todd W. Steigerwald, Austin, TX (US); Jeffrey C. Hailey, Austin, TX (US)

(73) Assignee: Dell Products, LP, Round Rock, TX (US)

( * ) Notice: Subject to any disclaimer, the term of this patent is extended or adjusted under 35 U.S.C. 154(b) by 495 days.

(21) Appl. No.: 12/372,050

(22) Filed: Feb. 17, 2009

(65) Prior Publication Data

US 2010/0207641 A1    Aug. 19, 2010

(51) Int. Cl.
*G01R 31/02* (2006.01)
*G01R 31/26* (2006.01)

(52) U.S. Cl. .................... 324/762.01; 324/555

(58) Field of Classification Search .............. 324/555, 324/500, 762.01, 537, 76.11
See application file for complete search history.

(56) References Cited

U.S. PATENT DOCUMENTS

| | | | |
|---|---|---|---|
| 6,166,354 A * | 12/2000 | Hause et al. | 219/390 |
| 6,201,403 B1 | 3/2001 | Rollin et al. | |
| 6,269,328 B1 | 7/2001 | Hirano | |
| 6,400,160 B1 | 6/2002 | Sampath | |
| 6,400,164 B1 * | 6/2002 | Sampath | 324/762.02 |
| 2008/0084218 A1 | 4/2008 | Hailey et al. | |
| 2008/0162740 A1 | 7/2008 | Jarboe et al. | |

* cited by examiner

*Primary Examiner* — Hoai-An D Nguyen
(74) *Attorney, Agent, or Firm* — Larson Newman, LLP

(57) ABSTRACT

A device is configured to evaluate electromagnetic characteristics of an integrated circuit. The device includes a fluid chamber, a first impeller, a second impeller, and a radio frequency measurement antenna. The fluid chamber is configured to receive the integrated circuit and to cool the integrated circuit. The first impeller is disposed within the fluid chamber and configured to distribute a first electromagnetic field produced by the integrated circuit within the fluid chamber along a first axis. The second impeller is within the fluid chamber and configured to distribute the first electromagnetic field produced by the integrated circuit within the fluid chamber along a second axis. The radio frequency measurement antenna is disposed proximate the fluid chamber and configured to measure an electric field and a magnetic field of the first electromagnetic field.

12 Claims, 6 Drawing Sheets

SYSTEM AND METHOD FOR EVALUATING THE ELECTROMAGNETIC COMPATIBILITY OF INTEGRATED CIRCUITS IN AN IN-SITU ENVIRONMENT

FIELD OF THE DISCLOSURE

This disclosure generally relates to information systems, and more particularly relates to a system and method for evaluating electromagnetic compatibility of integrated circuits in an in-situ environment.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements can vary between different applications, information handling systems can also vary regarding what information is handled, how the information is handled, how much information is processed, stored, or communicated, and how quickly and efficiently the information can be processed, stored, or communicated. The variations in information handling systems allow for information handling systems to be general or configured for a specific user or specific use such as financial transaction processing, airline reservations, enterprise data storage, or global communications. In addition, information handling systems can include a variety of hardware and software components that can be configured to process, store, and communicate information and can include one or more computer systems, data storage systems, and networking systems.

Integrated circuits (ICs) are etched from increasingly finer gate spacing, increasing the overall electromagnetic (EM) emissions bandwidth of the IC package well into the gigahertz (GHz) range. Additionally, processing ICs and high speed data switching ICs can have high and increasing heat generation, often requiring thermal energy removal by using large heatsinks, fluid cooling surfaces, plates, or coils, or thermoelectric cooling systems so that the IC can be functional and operate in the correct temperature range. Also, the processing ICs and high speed data switching ICs require large computing main systems to properly exercise the internal circuitry, especially those ICs that are an integral part of a larger computing system.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application.

Figure 1:
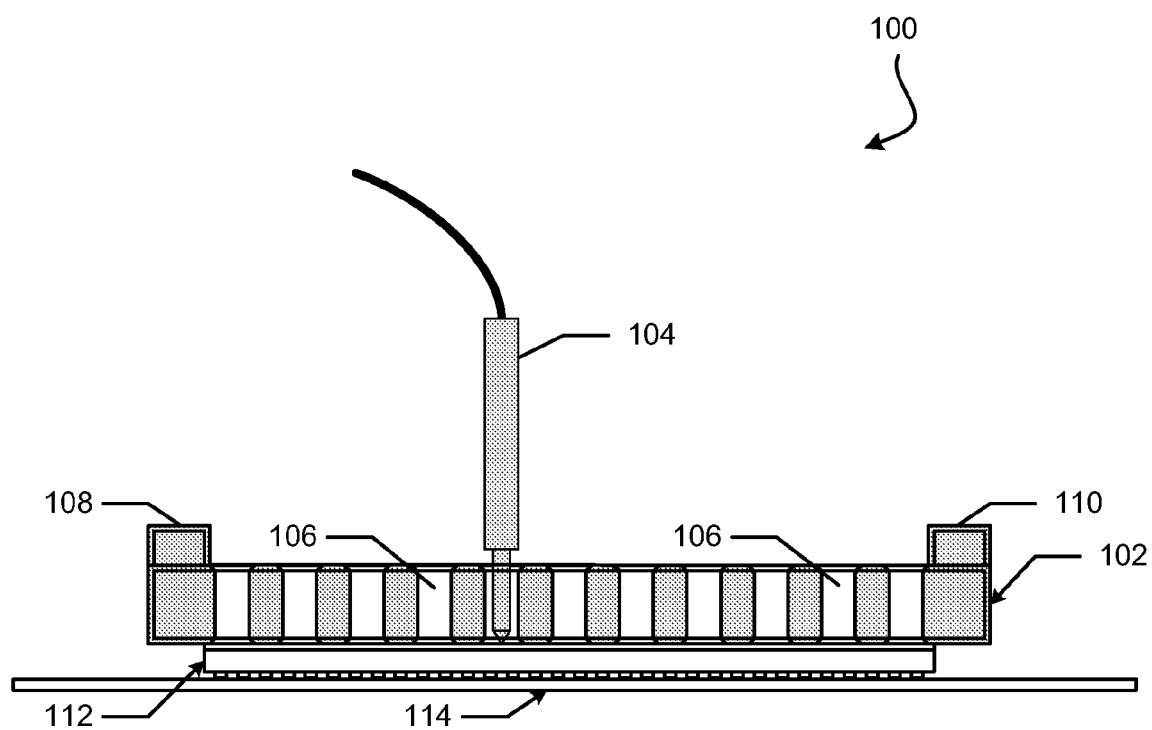
FIGS. 1-3 are schematic diagrams of an embodiment of an integrated electromagnetic test system.

FIG. 1 shows an integrated circuit (IC) electromagnetic (EM) test system 100 for use in an information handling system. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communications between the various hardware components.

The IC EM test system 100 includes a fluid chamber 102 and a test probe 104. The fluid chamber 102 includes a plurality of holes 106, a fluid inlet 108, and a fluid outlet 110. The fluid chamber 102 is placed in physical communication with an IC 112, which in turn is connected to a printed circuit board (PCB) 114. The holes 106 can provide the test probe 104 with access to the IC 112, such that the test probe 104 can be placed in physical communication with the IC 112 and/or placed a short distance above the IC.

Figure 2:
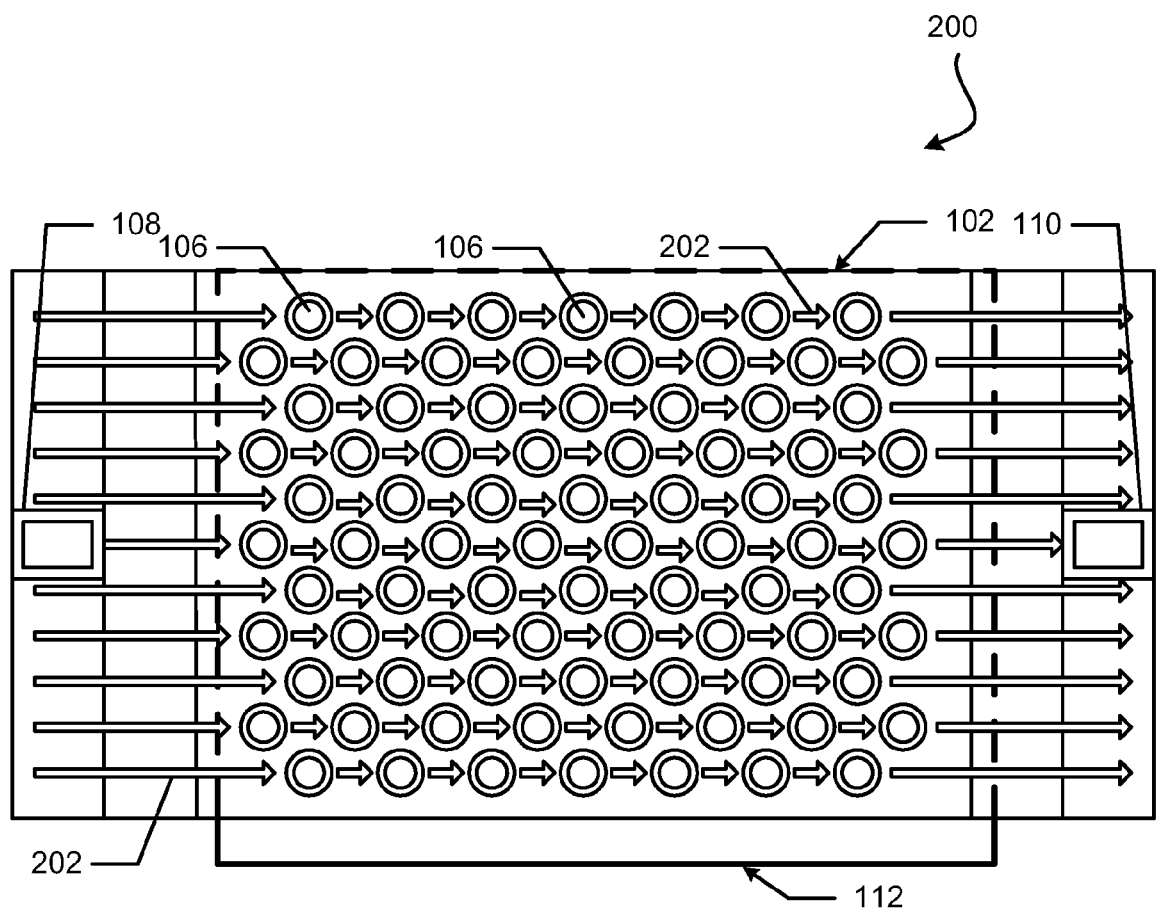
Figure 3:
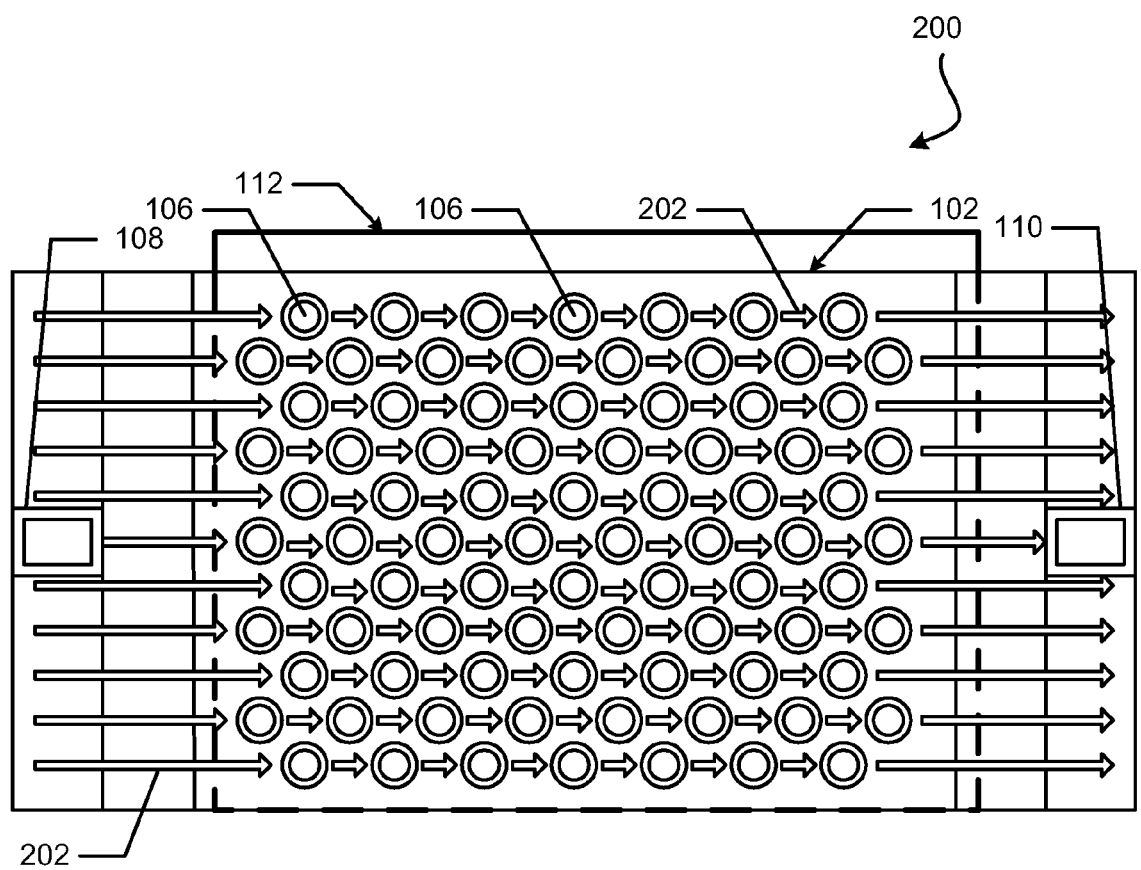

As the IC 112 operates with the PCB 114, the IC produces heat, an electric field, and a magnetic field. The heat produced by the IC 112 should be removed so that the IC does not over heat and shut down. Therefore, the heat from the IC 112 can be transferred to the fluid chamber 102 via the physical communication between the IC and the fluid chamber. Additionally, a fluid flow 202 can be provided through the fluid chamber 102 via the fluid inlet 108 and the fluid outlet 110, as shown in FIGS. 2 and 3. The fluid flow 202 can enter the fluid chamber 102 through the fluid inlet 108, can remove the heat transferred from the IC 112 to the fluid chamber, and can leave the fluid chamber through the fluid outlet 110. The fluid chamber 102, the fluid flow 202, and fluid type are preferably designed such that they do not interfere with and/or disrupt the electric and magnetic fields produced by the IC 112.

For example, the fluid chamber 102, the fluid flow 202, and the fluid type can be radio frequency (RF) invisible, such that they are free of ions or any other minerals that could disrupt the electric and magnetic fields produced by the IC 112. Thus, the test probe 104 can measure the electric and magnetic fields without interference from the fluid chamber 102 and/or the fluid flow 202. The electric and magnetic fields can be measured in an in-situ environment, such that the electric and magnetic fields are produced by the IC 112 during the operation of the IC under an intended usage environment. The IC 112 can be tested to verify that the electric and magnetic fields produced by the IC are within a compatibility range of a maximum amount of electric and magnetic fields to be produced in a system.

Thus, the fluid chamber 102 can remove heat from the IC 112 so that a proper operating temperature can be maintained in the IC while the electric and magnetic fields are measured. The test probe 104 can be inserted into each of the holes 106 so that the electric and magnetic fields can be measured for the IC 112 at the location of the holes. In one embodiment, a single test probe 104 can be used to measure the electric and magnetic fields at one hole 106 at a time. In another embodiment, multiple test probes 104 can be used such that the electric and magnetic fields at each of the holes 106 are tested at substantially the same time. However, some electric and magnetic field test probes can have limited sensing distances, therefore the EM measurement pattern can have data gaps while the fluid chamber 102 is placed in a single position on the IC. Additionally, the IC 112 can be larger than the fluid chamber 102, and as a result the testing area may not encompass the entire surface of the IC, as shown in FIGS. 2 and 3.

Thus, while testing the EM compatibility of the IC 112, the fluid chamber 102 can be moved around on the IC so that the entire surface area of the IC can be measured by the test probe 104. For example, the fluid chamber 102 can originally be placed in a first position, and the test probe 104 can be used to measure the electric and magnetic fields produced by the IC 112 at the locations of each of the holes 106 in the fluid chamber. After all of the measurements have been taken in the first position, the fluid chamber 102 can be shifted in the 'x' (left or right) or 'y' (up or down) direction, as shown in FIGS. 2 and 3, on the IC 112 so that different locations of the IC can be tested by the test probe 104. The fluid chamber 102 can continue to be shifted in both directions until all of the IC 112 has been tested. If any location on the IC 112 is measured more than once while shifting the fluid chamber 102 along the IC, the measurements for those locations can be averaged together to get a single reading for each of the locations. The data of the electric and magnetic fields produced by the IC 112 can then be analyzed to determine whether the electric and magnetic fields produced by the IC are within acceptable ranges.

Figure 4:
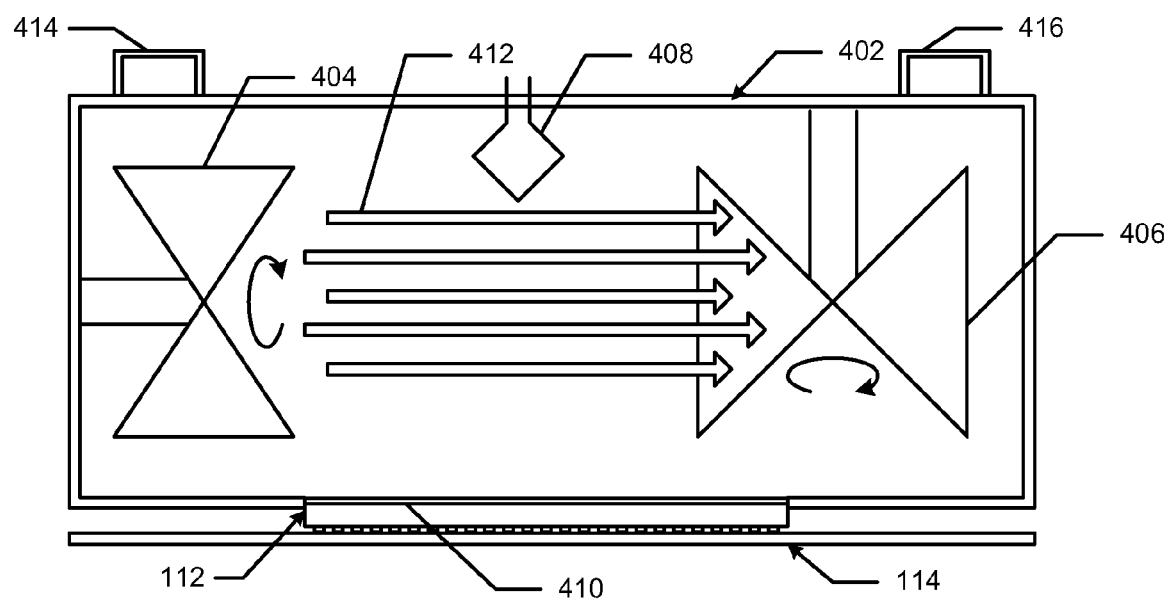
FIG. 4 is a schematic diagram of another embodiment of the integrated electromagnetic test system.

FIG. 4 shows another embodiment of the IC EM test system 400 including a fluid chamber 402, impellers 404 and 406, a radio frequency (RF) antenna 408, a window 410, a fluid inlet 412, and a fluid outlet 414. The fluid chamber 402 is connected to the impellers 404 and 406, to the RF antenna 408, to the window 410, to the fluid inlet 412, and to the fluid outlet 414. The window 410 is place in physical communication with the IC 112. In one embodiment, the window 410 can be in the bottom of the fluid chamber 402 so that the window is designed without taking the size of the IC 112 into consideration. The portions of the fluid chamber 402 other than the window 410 can be designed such that the electric and magnetic fields are reflected back into the fluid chamber. For example, the fluid chamber 402 can be lined with a sheet of copper, steel, mumetal, or other suitable ferrous metal that has a desirable magnetic permeability such that the electric and magnetic fields cannot leave the fluid chamber. In another embodiment, the copper sheet for the chamber 402 can be measured and cut to a specific size so that the window 410 matches the size of the of the IC 112.

The IC EM test system 400 can measure the electric and magnetic fields from the IC 112, and can also provide heat transfer from the IC via a fluid flow 416 through the fluid chamber 402. As the IC 112 operates with the PCB 114, the IC produces heat, an electric field, and a magnetic field. The heat produced by the IC 112 is transferred to the chamber 402 via the physical communication between the IC and the window 410. The fluid flow 416 can enter the fluid chamber 402 via the fluid inlet 412, can remove the heat transferred from the IC 112 to the fluid chamber, and can leave the fluid chamber through the fluid outlet 416. The chamber 402 and the fluid flow 416 are preferably designed such that they do not interfere with the electric and magnetic fields produced by the IC 112 so that the RF antenna 408 can measure the electric and magnetic fields. The electric and magnetic fields can be introduced into the fluid chamber 402 via the window 410 which is partially or totally invisible to electric and magnetic fields.

While the electric and magnetic fields are within the fluid chamber 402, the impellers 404 and 406 can each stir the electromagnetic field including the electric and magnetic fields along different axis. The impellers 404 and 406 can be placed at different angles within the fluid chamber. For example, the impellers 404 and 406 can be placed a ninety degree angles from each other, can be placed at forty-five degree angles from each other, and the like. Thus, the impellers 404 and 406 can evenly distribute the electromagnetic field within the fluid chamber 402 so that the RF antenna 408 can receive a measurement of the electric and magnetic fields produced by the IC 112. In one embodiment, motors can be used to rotate the impellers 404 and 406, and in another embodiment the fluid flow 416 can rotate the impellers. The data for the electric and magnetic fields produced by the IC 112 can then be analyzed to determine whether the electric and magnetic fields produced by the IC are within acceptable ranges. Thus, the fluid chamber 402 can allow the IC 112 to be measured while in a normal operating environment and under normal operating conditions and temperatures. In another embodiment, the IC EM test system 400 can be used to inject an electromagnetic field within proximity of the IC 112 so that a determination can be made whether the IC can continue to operate while receiving electromagnetic interference.

Figure 5:
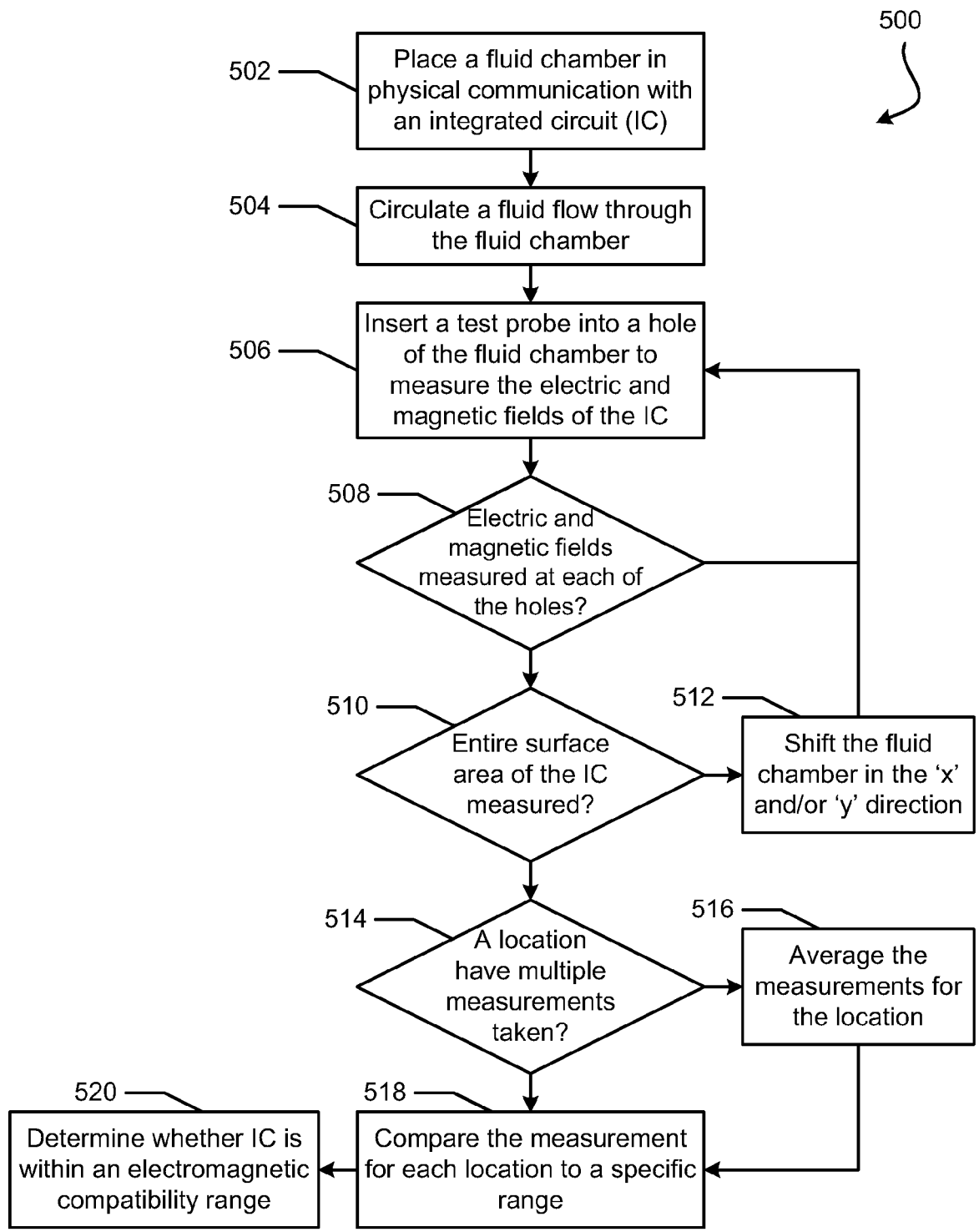
FIG. 5 is a flow diagram of a method for testing the electromagnetic compatibility of the integrated circuit.

FIG. 5 is a flow diagram of a method 500 for testing the EM compatibility of the IC 112. At block 502, a fluid chamber is place in physical communication with the IC. A fluid flow is circulated through the fluid chamber at block 504. The fluid flow is configured to remove heat produced during the operation of the IC. At block 506, a test probe is inserted into a hole of the fluid chamber to measure the electric and magnetic fields at the location of the hole. At block 508, a determination is made whether the electric and magnetic fields have been measured at each of the holes in the fluid chamber. If the electric and magnetic fields have not been measured at all of the holes the flow diagram repeats starting with block 506. If the electric and magnetic fields have been measured at all of the holes, a determination is made whether the entire surface area of the IC has been measured at block 510. At block 512, if the entire surface area of the IC has not been measured, the fluid chamber is shifted in the 'x' and/or 'y' direction and the flow diagram repeats starting with block 506. If the entire surface area of the IC has not been tested a determination is made whether any location has had multiple measurements taken at block 514. At block 516, if a location has had multiple measurements taken, the measurements are average together to get a single measurement for each of the locations. Upon each location having a single measurement, the measurements are compared to a specific EM range at block 518. A determination is made whether the IC is within an EM compatibility range at block 520.

Figure 6:
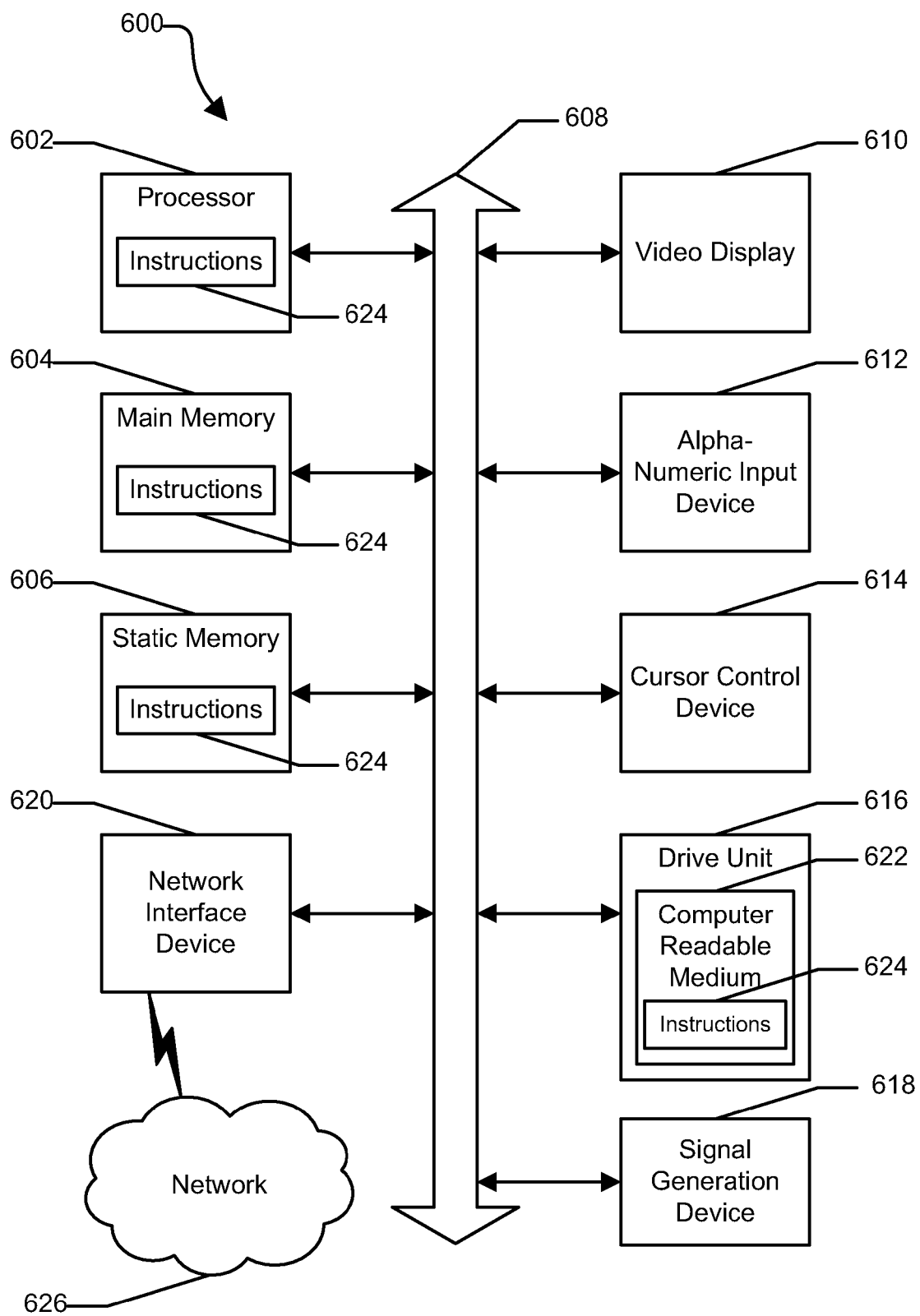
FIG. 6 is a block diagram of a general computer system.

FIG. 6 shows an illustrative embodiment of a general computer system 600 in accordance with at least one embodiment of the present disclosure. The computer system 600 can include a set of instructions that can be executed to cause the computer system to perform any one or more of the methods or computer based functions disclosed herein. The computer system 600 may operate as a standalone device or may be connected, e.g., using a network, to other computer systems or peripheral devices.

In a networked deployment, the computer system may operate in the capacity of a server or as a client user computer in a server-client user network environment, or as a peer computer system in a peer-to-peer (or distributed) network environment. The computer system 600 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system 600 can be implemented using electronic devices that provide voice, video or data communication. Further, while a single computer system 600 is illustrated, the term "system" shall also be taken to include any collection of systems or sub-systems that individually or jointly execute a set, or multiple sets, of instructions to perform one or more computer functions.

The computer system 600 may include a processor 602, e.g., a central processing unit (CPU), a graphics processing unit (GPU), or both. Moreover, the computer system 600 can include a main memory 604 and a static memory 606 that can communicate with each other via a bus 608. As shown, the computer system 600 may further include a video display unit 610, such as a liquid crystal display (LCD), an organic light emitting diode (OLED), a flat panel display, a solid state display, or a cathode ray tube (CRT). Additionally, the computer system 600 may include an input device 612, such as a keyboard, and a cursor control device 614, such as a mouse. The computer system 600 can also include a disk drive unit 616, a signal generation device 618, such as a speaker or remote control, and a network interface device 620.

In a particular embodiment, as depicted in FIG. 6, the disk drive unit 616 may include a computer-readable medium 622 in which one or more sets of instructions 624, e.g. software, can be embedded. Further, the instructions 624 may embody one or more of the methods or logic as described herein. In a particular embodiment, the instructions 624 may reside completely, or at least partially, within the main memory 604, the static memory 606, and/or within the processor 602 during execution by the computer system 600. The main memory 604 and the processor 602 also may include computer-readable media. The network interface device 620 can provide connectivity to a network 626, e.g., a wide area network (WAN), a local area network (LAN), or other network.

In an alternative embodiment, dedicated hardware implementations such as application specific integrated circuits, programmable logic arrays and other hardware devices can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

The present disclosure contemplates a computer-readable medium that includes instructions 624 or receives and executes instructions 624 responsive to a propagated signal, so that a device connected to a network 626 can communicate voice, video or data over the network 626. Further, the instructions 624 may be transmitted or received over the network 626 via the network interface device 620.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A system configured to evaluate electromagnetic characteristics of an integrated circuit, the system comprising:

an electromagnetic test probe configured to measure an electric field and a magnetic field produced by the integrated circuit; and a fluid chamber in physical communication with the integrated circuit, the fluid chamber configured to transfer heat from the integrated circuit to a fluid, and including:
a plurality of holes, each of the holes adapted to enable the electromagnetic test probe to be placed in physical communication with the integrated circuit.

2. The system of claim 1 further comprising:
a fluid inlet configured to provide the fluid to the fluid chamber for cooling the integrated circuit.

3. The system of claim 1 further comprising:
a fluid outlet configured to remove the fluid from the device.

4. The system of claim 1 wherein the fluid is a radio frequency invisible fluid.

5. The system of claim 1 wherein the fluid chamber is made from a radio frequency invisible polymer.

6. A method for evaluating electromagnetic characteristics of an integrated circuit, the method comprising:
placing a fluid chamber in physical communication with the integrated circuit;
circulating a fluid flow through the fluid chamber;
inserting a test probe into a hole of the fluid chamber;
measuring a first electric field and a first magnetic field produced by the integrated circuit at a first location of the hole; and
determining whether the integrated circuit is within an electromagnetic compatibility range based on the first electric field measurement and the first magnetic field measurement.

7. The method of claim 6 further comprising:
shifting the fluid chamber on the integrated circuit;
measuring a second electric field and a second magnetic field produced by the integrated circuit at a second location of the hole; and
verifying that the integrated circuit is within the electromagnetic compatibility range based on the first and second electric field measurements and the first and second magnetic field measurements.

8. The method of claim 6 further comprising:
shifting the fluid chamber on the integrated circuit;
measuring a second electric field and a second magnetic field produced by the integrated circuit at a second location of a second hole;
averaging the first and second electric field measurements;
averaging the first and second magnetic field measurements; and
verifying that the integrated circuit is within the electromagnetic compatibility range based on the average electric field measurement and the average magnetic field measurement.

9. The method of claim 8 wherein the second location of the second hole is the same as the first location of the first hole.

10. The method of claim 6 further comprising:
placing one of a plurality of second test probes into one of a plurality of second holes in the fluid chamber;
measuring a plurality of second electric fields and a plurality of second magnetic fields produced by the integrated circuit at the plurality of second holes; and
verifying that the integrated circuit is within the electromagnetic compatibility range based on the plurality of second electric field measurements and the plurality of second magnetic field measurements.

11. The method of claim 6 wherein the fluid flow is a radio frequency invisible fluid.

12. The method of claim 6 wherein the fluid chamber is made from a radio frequency invisible polymer.

* * * * *